(12) United States Patent
Lee et al.

(10) Patent No.: US 12,532,562 B2
(45) Date of Patent: Jan. 20, 2026

(54) SEMICONDUCTOR DEVICE INCLUDING SEMICONDUCTOR CHIPS STACKED IN A MULTI-LAYER STRUCTURE BY A FLIP-CHIP BONDING METHOD

(71) Applicant: SAMSUNG ELECTRONICS CO., LTD., Suwon-si (KR)

(72) Inventors: Hyeokjong Lee, Suwon-si (KR); Minho Kwon, Suwon-si (KR); Kyongsoon Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 401 days.

(21) Appl. No.: 18/106,143

(22) Filed: Feb. 6, 2023

(65) Prior Publication Data

US 2023/0299111 A1 Sep. 21, 2023

(30) Foreign Application Priority Data

Mar. 17, 2022 (KR) .................. 10-2022-0033499
Aug. 30, 2022 (KR) .................. 10-2022-0109427

(51) Int. Cl.
| | |
|---|---|
| *H10F 39/00* | (2025.01) |
| *H01L 21/66* | (2006.01) |
| *H01L 23/60* | (2006.01) |
| *H01L 25/065* | (2023.01) |
| *H10D 89/00* | (2025.01) |

(52) U.S. Cl.
CPC ............ *H10F 39/811* (2025.01); *H01L 22/14* (2013.01); *H01L 23/60* (2013.01); *H01L 25/0657* (2013.01); *H10D 89/00* (2025.01)

(58) Field of Classification Search
CPC ........ H10F 39/811; H01L 22/14; H01L 22/32; H01L 23/60; H01L 25/0657; H10D 89/00; H10D 89/819
See application file for complete search history.

(56) References Cited

U.S. PATENT DOCUMENTS

| | | |
|---|---|---|
| 7,375,757 B1 | 5/2008 | Hoshino et al. |
| 8,508,639 B2 | 8/2013 | Mabuchi et al. |
| 9,054,005 B2 | 6/2015 | Tsukimura |
| 9,240,330 B2 | 1/2016 | Takeda et al. |
| 9,391,112 B2 * | 7/2016 | Shimotsusa ........... H10F 39/809 |

(Continued)

FOREIGN PATENT DOCUMENTS

| | | |
|---|---|---|
| JP | 2016-091576 | 5/2016 |
| JP | 2021-150307 | 9/2021 |
| WO | 2021/187187 | 9/2021 |

*Primary Examiner* — Dao H Nguyen
(74) *Attorney, Agent, or Firm* — Morgan, Lewis & Bockius LLP

(57) ABSTRACT

A semiconductor device includes: a first semiconductor chip having an upper surface divided into a pixel array region and a connection region, wherein a plurality of pads are disposed in the connection region; and a second semiconductor chip disposed on the first semiconductor chip, wherein the plurality of pads include: a first bonding pad for connection with an external circuit; and a first probing pad adjacent to the first bonding pad and for an electrical die sorting (EDS) test, and wherein the second semiconductor chip includes: a first space overlapping the first bonding pad in a vertical direction and in which at least a portion of an electrostatic discharge protection circuit is formed.

20 Claims, 13 Drawing Sheets

(56) References Cited

U.S. PATENT DOCUMENTS

| | | | |
|---|---|---|---|
| 9,865,641 B2 | 1/2018 | Takemoto | |
| 10,090,352 B2 * | 10/2018 | Kumano | H01L 23/481 |
| 10,991,743 B2 | 4/2021 | Iwafuchi | |
| 11,102,440 B2 * | 8/2021 | Kobayashi | H10D 89/931 |
| 12,034,027 B2 * | 7/2024 | Zang | H10F 39/182 |
| 2008/0217786 A1 * | 9/2008 | Kasaoka | H01L 24/05 |
| | | | 257/E21.585 |
| 2013/0105924 A1 * | 5/2013 | Kobayashi | H10F 39/026 |
| | | | 438/69 |
| 2020/0195916 A1 | 6/2020 | Ishii et al. | |
| 2022/0415935 A1 * | 12/2022 | Huang | H10F 39/807 |
| 2023/0060208 A1 * | 3/2023 | Chang | H01L 24/32 |

\* cited by examiner

SEMICONDUCTOR DEVICE INCLUDING SEMICONDUCTOR CHIPS STACKED IN A MULTI-LAYER STRUCTURE BY A FLIP-CHIP BONDING METHOD

CROSS-REFERENCE TO RELATED APPLICATIONS

This application claims priority under 35 U.S.C. § 119 to Korean Patent Application Nos. 10-2022-0033499, filed on Mar. 17, 2022, and 10-2022-0109427, filed on Aug. 30, 2022, respectively, in the Korean Intellectual Property Office, the disclosures of which are incorporated by reference herein in their entireties.

TECHNICAL FIELD

Embodiments of the present inventive concept relate to a semiconductor device, and more particularly, to a semiconductor device including semiconductor chips stacked in a multi-layer structure by a flip-chip bonding method.

DISCUSSION OF THE RELATED ART

In a semiconductor post-process for manufacturing semiconductor products, an electrical die sorting (EDS) test may be performed, and packaging may be performed after the EDS test is completed. In the EDS test, it may be determined whether each of the semiconductor chips included in the semiconductor wafer is defective or not. In the process of packaging, generally, each of the semiconductor chips may be stacked in a multi-layer structure according to the specifications of the semiconductor product.

Various impacts or forces may be applied to the semiconductor chips during the process of performing the EDS test and packaging. Typically, a plurality of pads for the EDS test may be formed on upper surfaces of the semiconductor chips. In the EDS test, a physical impact may be applied to the pads during probing, so that a probing trace may be left on the pads. In the process of performing the packaging, the connection strength between the semiconductor chips may be reduced due to the probing trace, and while wiring or bump connections for connections with an external circuit are performed on the pads, a physical impact may be applied to the pads.

SUMMARY

Embodiments of the present inventive concept provide a semiconductor device capable of minimizing the effect of a physical impact applied to pads from the outside during an EDS test and packaging process.

Embodiments of the present inventive concept provide a semiconductor device that can be stably produced in spite of a physical impact applied to pads from the outside during an EDS test and packaging process.

According to an embodiment of the present inventive concept, a semiconductor device includes: a first semiconductor chip having an upper surface divided into a pixel array region and a connection region, wherein a plurality of pads are disposed in the connection region; and a second semiconductor chip disposed on the first semiconductor chip, wherein the plurality of pads include: a first bonding pad for connection with an external circuit; and a first probing pad adjacent to the first bonding pad and for an electrical die sorting (EDS) test, and wherein the second semiconductor chip includes: a first space overlapping the first bonding pad in a vertical direction and in which at least a portion of an electrostatic discharge protection circuit is formed.

According to an embodiment of the present inventive concept, a semiconductor device includes: a first semiconductor chip having a first surface divided into a first region and a second region, wherein a plurality of pads are disposed in the second region; and a second semiconductor chip stacked under the first semiconductor chip in a vertical direction with the first semiconductor chip, wherein the plurality of pads include a first bonding pad and a first probing pad, wherein the first bonding pad is for connection with an external circuit, and the first probing pad is adjacent to the first bonding pad and is for an electrical die sorting (EDS) test, wherein the second semiconductor chip includes: a first space overlapping the first bonding pad in the vertical direction; a second space overlapping the first probing pad in the vertical direction: and a third space adjacent to at least one of the first space or the second space in a horizontal direction, wherein the second semiconductor chip further includes an electrostatic discharge protection circuit and an input/output circuit, wherein a first portion of the electrostatic discharge protection circuit is formed in the first space, and a second portion of the electrostatic discharge protection circuit is formed in the second space, and wherein the input/output circuit is formed in the second space or the third space.

According to an embodiment of the present inventive concept, a semiconductor device includes: a first semiconductor chip having a first surface divided into a first region and a second region, wherein a plurality of pads are disposed in the second region; and a second semiconductor chip disposed under the first semiconductor chip, and wherein the plurality of pads include a first bonding pad and a first probing pad, wherein the first bonding pad is for connection with an external circuit, and the first probing pad is adjacent to the first bonding pad and is for an electrical die sorting (EDS) test, wherein the first semiconductor chip includes a dummy wiring layer, and the second semiconductor chip includes an electrostatic discharge protection circuit and an input/output circuit, wherein the dummy wiring layer is formed in a space inside the first semiconductor chip, under the first bonding pad, and vertically overlapping with the first bonding pad, wherein a first portion of the electrostatic discharge protection circuit is formed in a space inside the second semiconductor chip, under the dummy wiring layer, and vertically overlapping with the first bonding pad, wherein a second portion of the electrostatic discharge protection circuit is formed in a space inside the second semiconductor chip, under the first probing pad, and vertically overlapping with the first probing pad, and wherein, the input/output circuit is formed in a space inside the second semiconductor chip, and is formed in all or some of a space that does not overlap the first bonding pad, a space that overlaps the first probing pad, and a space that does not overlap the first probing pad.

BRIEF DESCRIPTION OF THE FIGURES

The above and other features of the present inventive concept will become more apparent by describing in detail exemplary embodiments thereof, with reference to the accompanying drawings, in which.

DETAILED DESCRIPTION OF THE EMBODIMENTS

Embodiments of the present invention will be described more fully hereinafter with reference to the accompanying drawings.

Figure 1:
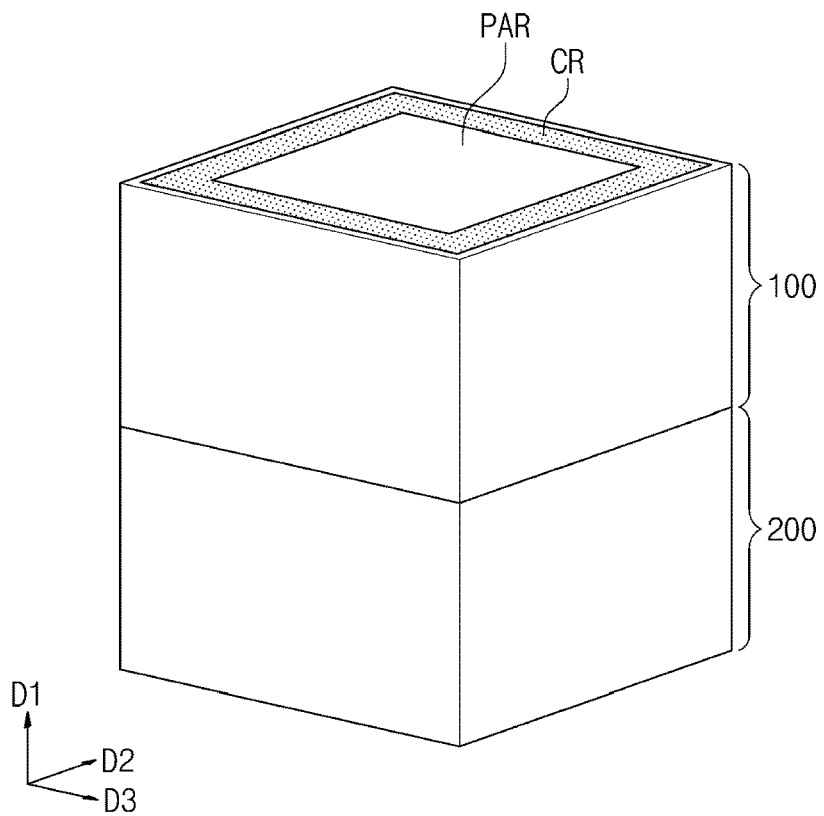
FIG. 1 is a perspective view illustrating a semiconductor device according to an embodiment of the present inventive concept.
Figure 2:
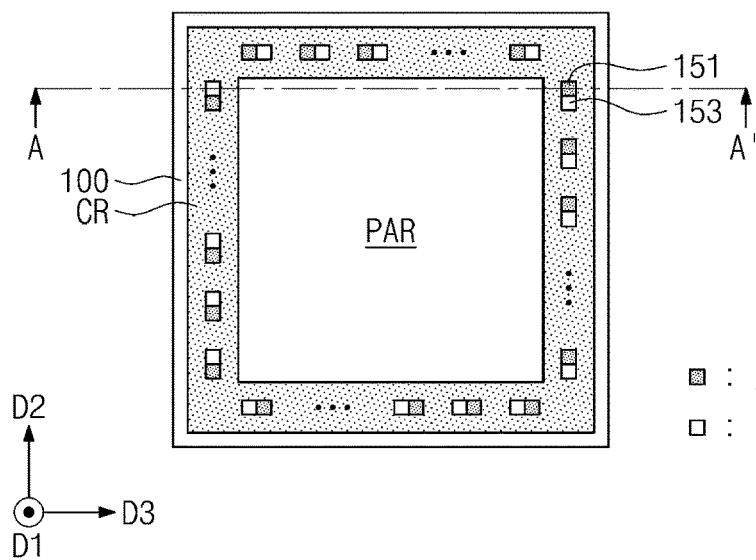
FIG. 2 is a plan view for describing a semiconductor device of FIG. 1.
Figure 3:
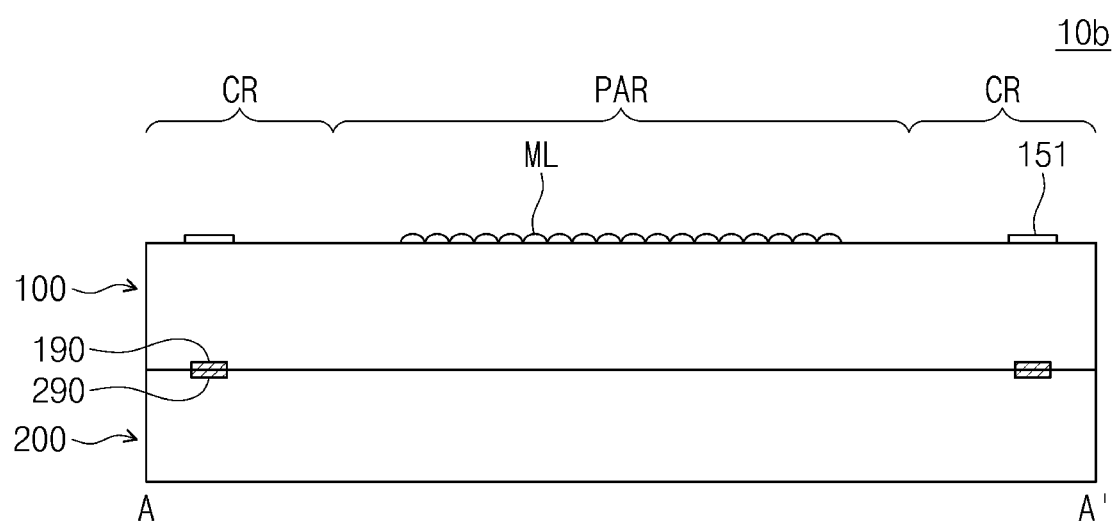
FIG. 3 is a cross-sectional view of the semiconductor device of FIG. 2 taken along line A-A'.

FIG. 1 is a perspective view illustrating a semiconductor device according to an embodiment of the present inventive concept. FIG. 2 is a plan view for describing a semiconductor device of FIG. 1. FIG. 3 is a cross-sectional view of the semiconductor device of FIG. 2 taken along line A-A'.

Referring to FIGS. 1, 2, and 3, a semiconductor device 10, 10a, or 10b may be illustrated based on directions D1, D2, and D3 orthogonal to each other. Directions D1, D2, and D3 may be uniformly applied in FIGS. 5A, 5B, 5C, 7, 8A, 8B, 8C and other drawings referenced in the present inventive concept.

The semiconductor device 10, 10a, or 10b may include a first semiconductor chip 100 and a second semiconductor chip 200, and the second semiconductor chip 200 may be stacked under the first semiconductor chip 100 in a vertical direction (e.g., the D1 direction) with the first semiconductor chip 100. In this case, the first semiconductor chip 100 and the second semiconductor chip 200 may be physically/electrically connected to each other through a through-silicon-via (TSV) or metal electrodes (e.g., 190 and 290 in FIG. 3).

In an embodiment of the present inventive concept, the semiconductor devices 10, 10a, and 10b may be manufactured by stacking the first semiconductor chip 100 and the second semiconductor chip 200 in a multi-layer structure according to the specifications of the semiconductor product.

In an embodiment of the present inventive concept, the first semiconductor chip 100 may have an upper surface divided into a pixel array region PAR and a connection region CR. For example, the pixel array region PAR may be positioned in a central region of the upper surface of the first semiconductor chip 100, and the connection region CR may at least partially surround the pixel array region PAR.

In an embodiment of the present inventive concept, the first semiconductor chip 100 may be a pixel chip, and the second semiconductor chip 200 may be a logic chip. For example, the first semiconductor chip 100 may include image pixels for an image sensor, and the image pixels may be formed under micro lenses MLs included in the pixel array region PAR. The second semiconductor chip 200 may include driving circuits for the image pixels.

The first semiconductor chip 100 may include a plurality of pads disposed in the connection region CR and including a plurality of probing pads and a plurality of bonding pads.

The plurality of probing pads may be for an EDS (electrical die sorting) test of a semiconductor post-process. During the EDS test, electrical signals are applied to the inside of the semiconductor device 10, 10a, or 10b through the plurality of probing pads to determine the electrical characteristics of various semiconductor devices included in the semiconductor package 10, 10a, or 10b. In an embodiment of the present inventive concept, the EDS test may include an electrical test (ET) and a burn-in test.

The plurality of bonding pads may be for connection with an external circuit during packaging of a semiconductor post-process. During the packaging, a wiring or a connection bump having a ball shape is disposed on the upper portion of each bonding pad such that the semiconductor device 10, 10a, or 10b may be electrically connected to an external circuit such as an external substrate or an electrical board. In one embodiment of the present inventive concept, the packaging may include flip chip packaging or wafer level chip scale packaging.

One bonding pad and one probing pad may be formed to be adjacent to each other as illustrated in FIG. 2 to form one pad-pair. For example, a first bonding pad 151 among the plurality of bonding pads and a first probing pad 153 among the plurality of probing pads may be disposed adjacent to each other, and the remaining bonding pads and the remaining probing pads may also be disposed in a shape similar to that of the first bonding pad 151 and the first probing pad 153.

The semiconductor device according to an embodiment of the present inventive concept by the above configuration, includes a first semiconductor chip and a second semiconductor chip disposed under the first semiconductor chip, and can effectively disperse physical impacts applied to the semiconductor device through pads during probing and bonding, by providing bonding pads for connection with external circuits on the upper surface of the first semiconductor chip separately from probing pads for EDS testing.

One bonding pad and one probing pad may be arranged to form a pad-pair, and one or more spaces may be defined in lower portions of the bonding pad and the probing pad forming one pad-pair. According to an embodiment of the present inventive concept, since specific circuits (e.g., an input/output circuit or an electrostatic discharge protection circuit) and a dummy wiring layer are disposed at predetermined positions in the defined spaces, the semiconductor device may be implemented to operate normally as much as possible despite the physical impact. Spaces under the bonding pad and the probing pad will be described with reference to FIGS. 5A, 5B and 5C. Spaces in which the electrostatic discharge (EDS) protection circuit is formed will be described with reference to FIG. 7, and spaces in which the input/output circuit is formed will be described with reference to FIGS. 8A, 8B, and 8C.

According to an embodiment of the present inventive concept, the semiconductor device can be produced stably despite the physical impact while minimizing the influence of the physical impact by the above configuration.

Figure 4:
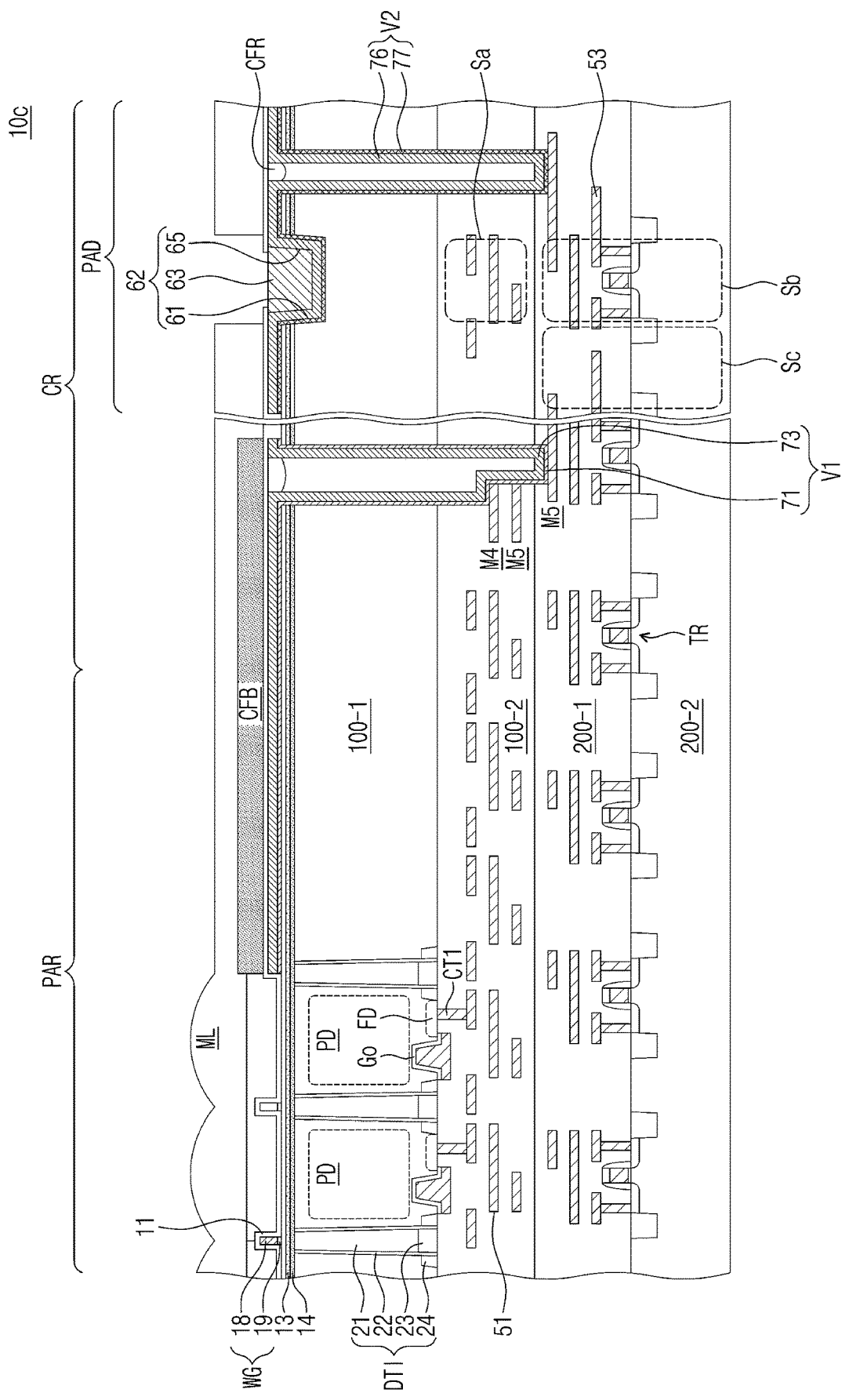
FIG. 4 is a cross-sectional view illustrating a portion of a semiconductor device of FIG. 3.

FIG. 4 is a cross-sectional view illustrating a portion of a semiconductor device of FIG. 3.

In FIG. 4, a cross-sectional view of a portion of the pixel array region PAR and a portion of the connection region CR of the semiconductor device 10b of FIG. 3 is illustrated.

Referring to FIGS. 3 and 4, the semiconductor device 10c may include the first semiconductor chip 100 and the second semiconductor chip 200. The first semiconductor chip 100 may include a first substrate 100-1 and a first insulating layer 100-2, and the second semiconductor chip 200 may include a second substrate 200-2 and a second insulating layer 200-1.

A plurality of pixels are disposed on a first substrate 100-1, a plurality of transistors TRs are disposed on a second substrate 200-2, and wirings 51 and 53 may be disposed in a first insulating layer 100-2 and a second insulating layer 200-1, respectively.

The semiconductor device 10c may include the pixel array region PAR and the connection region CR, and the connection region CR may include a pad region PAD.

The pixel array region PAR may include the plurality of pixels, and as some components included in each of the plurality of pixels, a photoelectric conversion unit PD, a floating diffusion region FD, and a gate insulating layer Go for covering a transmission gate may be formed in the first substrate 100-1. The plurality of pixels may be separated by a pixel isolation unit DTI that includes a side insulating layer 21, a polysilicon pattern 22, a buried insulating pattern 23, and a shallow device isolation unit 24, and fixed charge layers 13 and 14 may be disposed on the plurality of pixels. The pixel array region PAR may further include a light blocking grid WG disposed on the fixed charge layers 13 and 14 and including a low refractive index pattern 18 and a light blocking pattern 19. The light blocking grid WG may be covered with a passivation layer 11, and the micro lenses MLs may be disposed on the passivation layer 11. The floating diffusion region FD may be connected to the wiring 51 included in the first insulating layer 100-2 through a contact CT1.

The pad region PAD included in the connection region CR may include an external connection pad 62. The external connection pad 62 may be disposed in a trench 61 penetrating the fixed charge layers 13 and 14, and may be disposed in a portion of the first substrate 100-1. The external connection pad 62 may include a diffusion prevention pattern 65 and a pad pattern 63 that conformally cover an inner wall and a bottom surface of the trench 61. The external connection pad 62 may be one of the plurality of pads described above with reference to FIG. 2. For example, the external connection pad 62 may be one of the plurality of bonding pads and the plurality of probing pads.

In an embodiment of the present inventive concept, an optical black pattern CFB may be additionally formed over the pixel array region PAR and the connection region CR of the semiconductor device 10c, and a first via V1 and a second via V2 in the connection region CR may be additionally formed. The first via V1 may include a first diffusion barrier pattern 71 and a first via pattern 73 disposed on a first diffusion barrier pattern 71, and may penetrate the first substrate 100-1, the first insulating layer 100-2, and the second insulating layer 200-1 to be connected to some of the wirings 51 and 53 at the same time. For example, as illustrated in FIG. 4, the first via V1 may be connected to an uppermost metal M5 and a next uppermost metal M4 as the wiring 51 disposed on the first insulating layer 100-2. In addition, the first via V1 may be connected to the uppermost metal M5 as the wiring 53 disposed on the second insulating layer 200-1, at the same time. The second via V2 may include a second diffusion barrier pattern 77 and a second via pattern 76 disposed on a second diffusion barrier pattern 77, and may penetrate the first substrate 100-1, the first insulating layer 100-2, and the second insulating layer 200-2 to be connected to some of the wiring 53 at the same time.

The semiconductor device 10c may include one or more spaces (e.g., Sa, Sb, and Sc) defined in the first semiconductor chip 100 and the second semiconductor chip 200.

In an embodiment of the present inventive concept, the space Sa may be included in the first semiconductor chip 100, and the spaces Sb and Sc may be included in the second semiconductor chip 200. The spaces Sa and Sb may be spaces overlapping the lower portion of the external connection pad 62 in a vertical direction, and the space Sc may be a space adjacent to the space Sb in a horizontal direction without overlapping the external connection pad 62 in a vertical direction. For example, the space Sc may be a space adjacent to the space Sb toward the pixel array area PAR. For example, the space Sc may be a space adjacent to the space Sb toward the center of the semiconductor device 10c.

In an embodiment of the present inventive concept, specific circuits (e.g., the input/output circuit or the electrostatic discharge protection circuit) and a dummy wiring layer are disposed in spaces (e.g., Sa, Sb, Sc) such that the semiconductor device 10c operates as normal as possible despite a physical impact applied from the outside through the external connection pad 62.

Figure 5A:
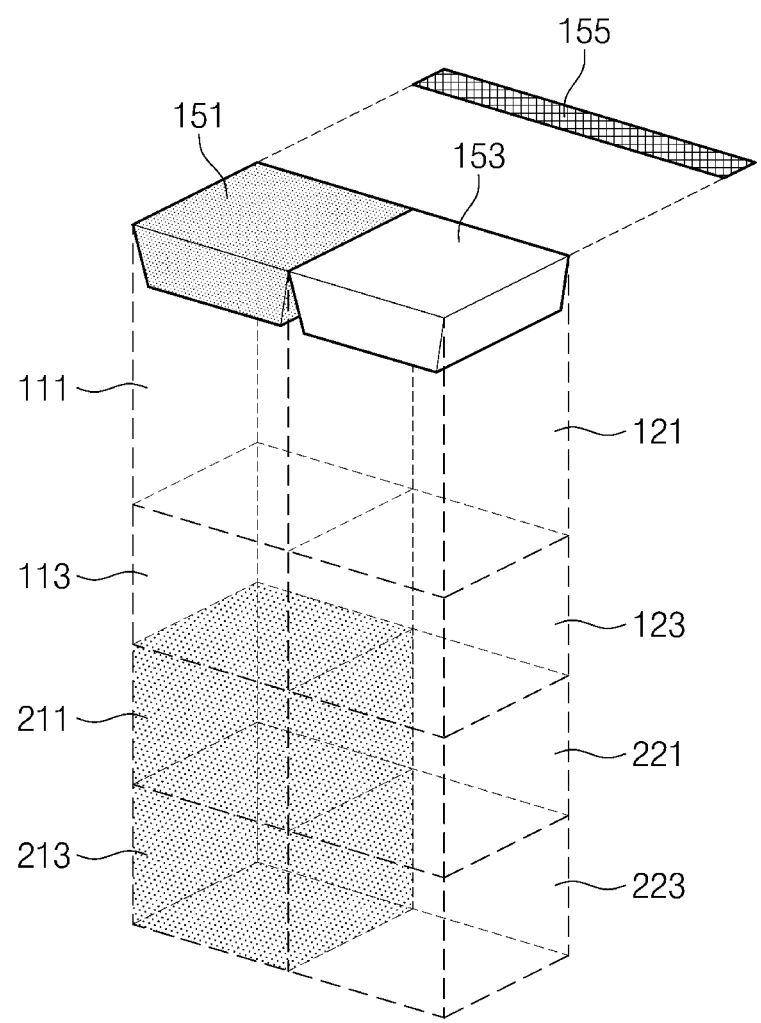
FIGS. 5A, 5B and 5C are diagrams for describing spaces of lower portions of a bonding pad and a probing pad forming one pad-pair of FIG. 2.
Figure 5B:
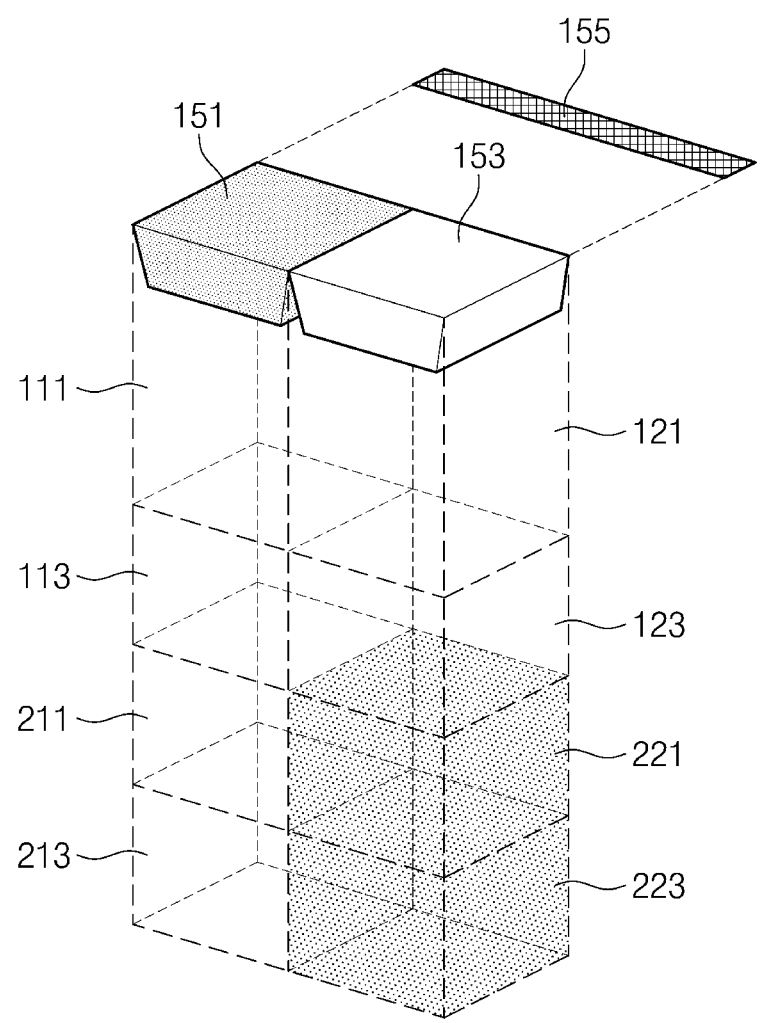
Figure 5C:
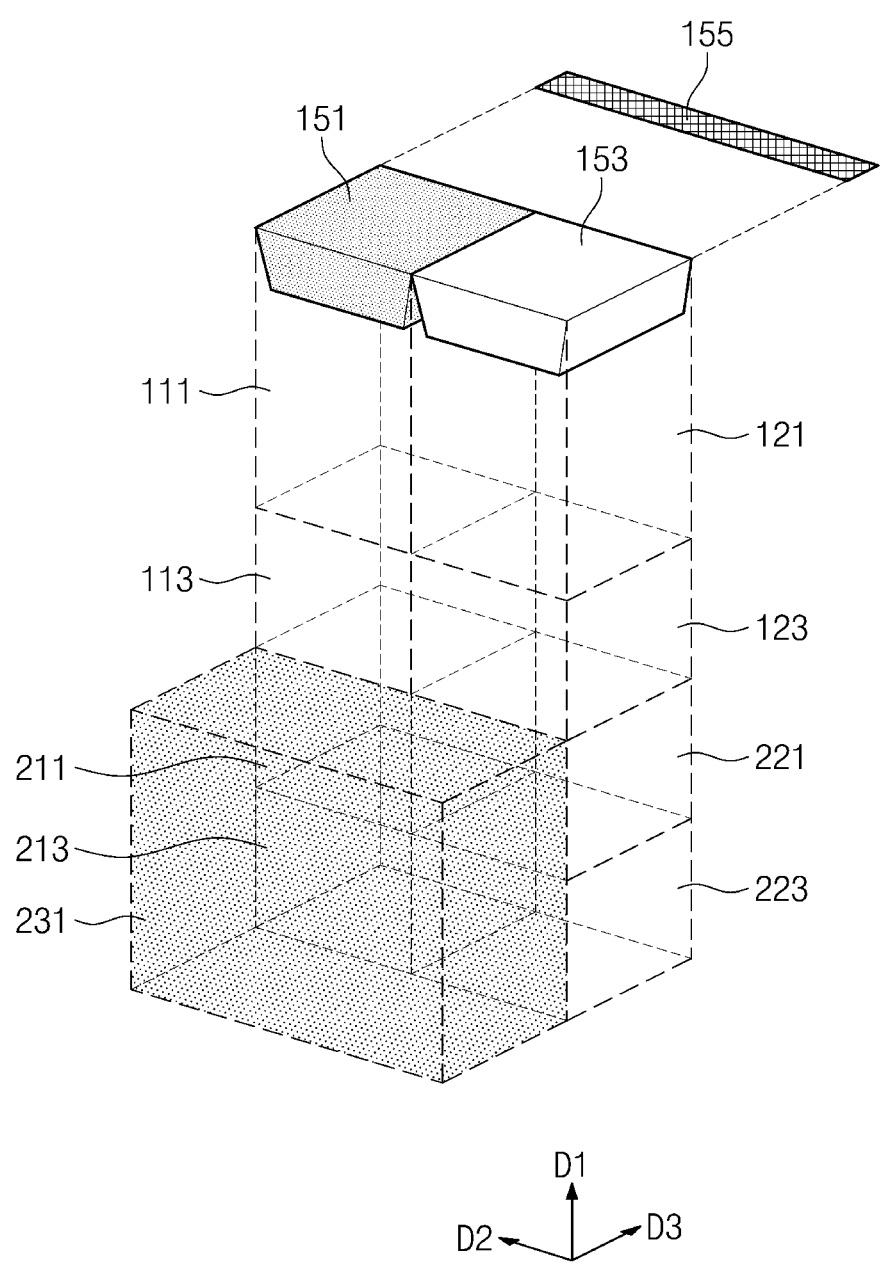

FIGS. 5A, 5B and 5C are diagrams for describing spaces of lower portions of a bonding pad and a probing pad forming one pad-pair of FIG. 2.

In FIGS. 5A, 5B and 5C, an edge 155 of a semiconductor device (e.g., 10, 10A, 10B, or IOC in FIGS. 1 to 4) is illustrated, and spaces 111, 113, 211, 213 121, 123, 221, and 223 positioned under the first bonding pad 151 and the first probing pad 153 are illustrated together with the first bonding pad 151 and the first probing pad 153 among the plurality of pads in FIG. 2.

For example, the spaces 111, 113, 211, and 213 may be positioned under the first bonding pad 151, and the spaces 121, 123, 221, and 223 may be positioned under the first probing pad 153. For example, the spaces 111, 113, 211, and 213 may overlap the first bonding pad 151, and the spaces 121, 123, 221, and 223 may overlap the first probing pad 153. The spaces 111, 113, 121, and 123 may be included in the first semiconductor chip (e.g., 100 of FIG. 1), and the spaces 211, 213, 221, and 223 may be included in the second semiconductor chip (e.g., 200 of FIG. 1).

For example, the spaces 111 and 121 may be included in the first substrate (e.g., 100-1 of FIG. 4) of the first semiconductor chip, and the spaces 113 and 123 may be included in the first insulating layer (e.g., 100-2 of FIG. 4) of the first semiconductor chip. The spaces 211 and 221 may be included in the second insulating layer (e.g., 200-1 of FIG. 4) of the second semiconductor chip, and the spaces 213 and 223 may be included in the second substrate (e.g., 200-2 of FIG. 4) of the second semiconductor chip.

Referring to FIG. 5A, the spaces 211 and 213 may be included in the second semiconductor chip and vertically overlap the first bonding pad 151. Hereinafter, the spaces 211 and 213 may be referred to as a 'first space'.

Referring to FIG. 5B, the spaces 221 and 223 may be included in the second semiconductor chip and vertically overlap the first probing pad 153. Hereinafter, the spaces 221 and 223 may be referred to as a 'second space'.

Referring to FIG. 5C, a space 231 may be included in the second semiconductor chip and may be horizontally adjacent to at least one of the first space or the second space. Hereinafter, the space 231 may be referred to as a 'third space'. For example, the space 231 might not overlap the first bonding pad 151 and the first probing pad 153.

In FIG. 5C, the third space is illustrated to be horizontally adjacent to both the first space and the second space, but this is only as an example. In an embodiment of the present inventive concept, the third space may be a space adjacent to at least one of the first space and the second space in a horizontal direction.

In an embodiment of the present inventive concept, in relation to physical impacts applied to the first to third spaces as EDS testing and packaging are performed on the semiconductor device, the first space may receive a physical impact due to the bonding, and the second space may receive a physical impact due to the probing. Since the physical impact due to the bonding is stronger than the physical impact due to the probing, the physical impact applied to the first space may be the largest, and the magnitude of the physical impact applied in the order of the second space and the third space may be reduced.

In an embodiment of the present inventive concept, at least a portion of the electrostatic discharge protection circuit may be formed in the first space. When a portion of the electrostatic discharge protection circuit is formed in the first space, another portion of the electrostatic discharge protection circuit may be formed in the second space. The electrostatic discharge protection circuit may prevent electrostatic discharge from flowing into circuit components included in the semiconductor device and may discharge the electrostatic discharge to the outside.

In an embodiment of the present inventive concept, at least a portion of the input/output circuit may be formed in the second space. When a portion of the input/output circuit is formed in the second space, another portion of the input/output circuit may be formed in the third space. The input/output circuit may be connected to the first probing pad 153 and then may allow electrical signals to be applied to the inside of the first semiconductor chip or the second semiconductor chip.

Referring to FIGS. 5A, 5B and 5C, the first semiconductor chip may include a dummy wiring layer. In an embodiment of the present inventive concept, the dummy wiring layer may be formed under the first bonding pad 151. For example, the dummy wiring layer may be formed in the space 113. In an embodiment of the present inventive concept, the dummy wiring layer may include metal wirings that are electrically floating or connected to one or more power lines.

In an embodiment of the present inventive concept, the semiconductor device may include a plurality of power lines connected to the input/output circuit and supplying power. The plurality of power lines may be formed in the second space or the third space based on one or more spaces (e.g., 221, 223, and 231) in which the input/output circuit is formed.

Figure 6A:
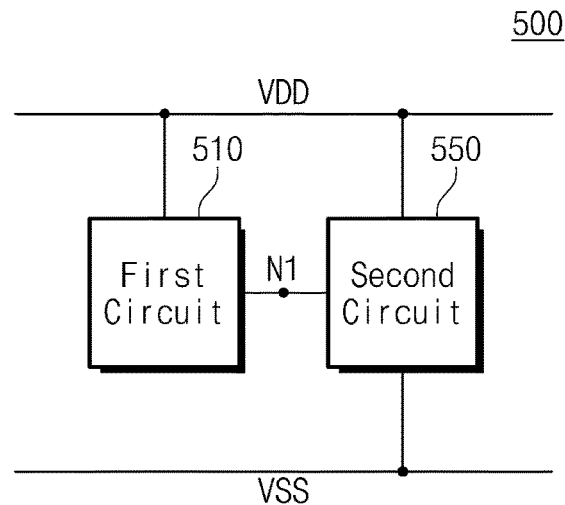
FIGS. 6A and 6B are block diagrams illustrating an electrostatic discharge protection circuit included in a semiconductor device of FIGS. 1 to 4 according to an embodiment of the present inventive concept.
Figure 6B:
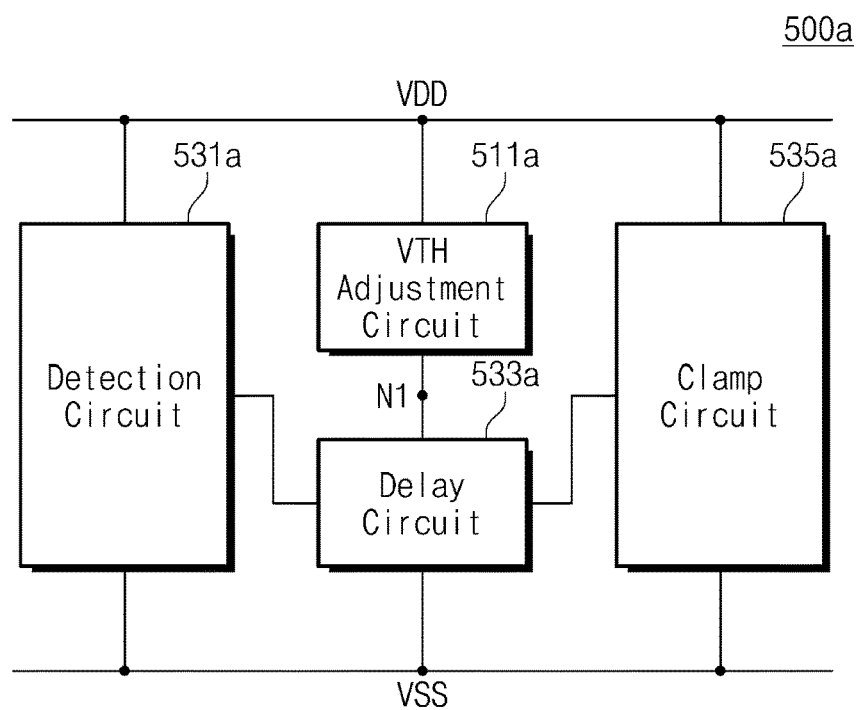
Figure 6C:
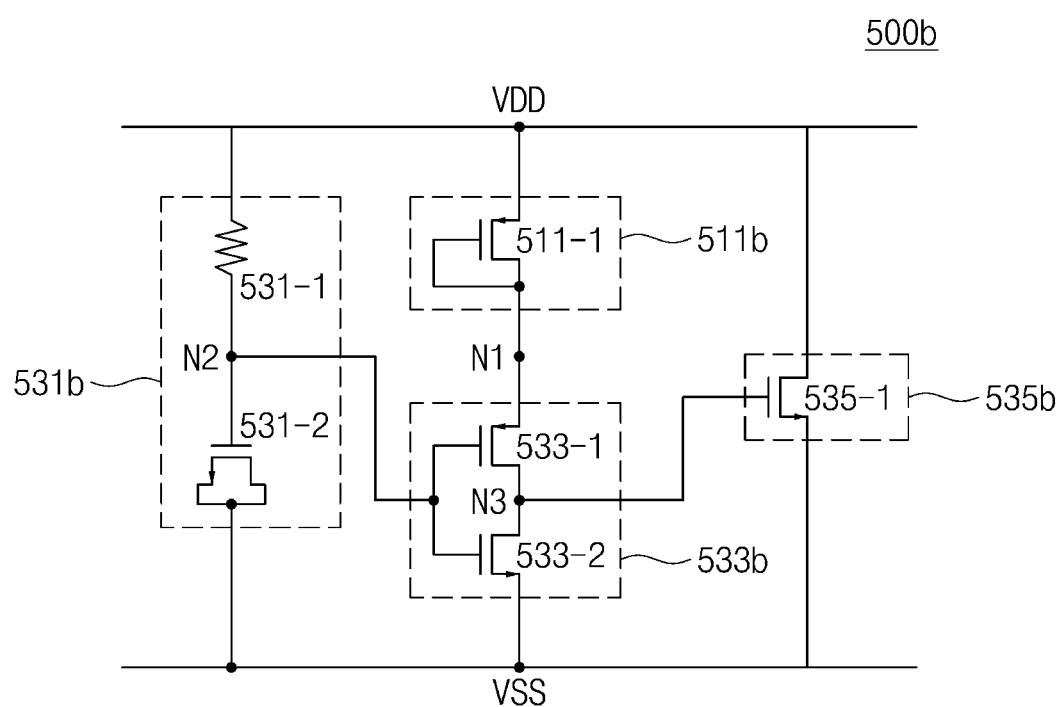
FIG. 6C is a circuit diagram illustrating an electrostatic discharge protection circuit of FIGS. 6A and 6B according to an embodiment of the present inventive concept.

FIGS. 6A and 6B are block diagrams illustrating an electrostatic discharge protection circuit included in a semiconductor device of FIGS. 1 to 4 according to an embodiment of the present inventive concept. FIG. 6C is a circuit diagram illustrating an electrostatic discharge protection circuit of FIGS. 6A and 6B according to an embodiment of the present inventive concept.

Referring to FIG. 6A, an electrostatic discharge protection circuit 500 may include a first circuit 510 and a second circuit 550.

The first circuit 510 may be electrically connected to a first power line and a first node N1, and the second circuit 550 may be electrically connected to the first power line, the first node N1, and a second power line.

In an embodiment of the present inventive concept, the first power line may supply a first power VDD, and the second power line may supply a second power VSS.

In an embodiment of the present inventive concept, the first circuit 510 may include one or more circuit components, and even if some of the circuit components are damaged by a physical impact from the outside, the first circuit 510 may be a circuit that does not significantly affect the normal operation of the electrostatic discharge protection circuit 500. For example, the first circuit 510 may be a circuit capable of minimizing the influence of an external physical impact more than the second circuit 550. Accordingly, the first circuit 510 may be disposed in a space receiving a relatively strong physical impact among spaces positioned under the pads of the semiconductor device. For example, the first circuit 510 may be disposed under each bonding pad of the semiconductor device, and the second circuit 550 may be disposed under each probing pad of the semiconductor device.

Referring to FIGS. 6A and 6B, an electrostatic discharge protection circuit 500a may include a threshold voltage adjustment circuit 511a, a detection circuit 531a, a delay circuit 533a, and a clamp circuit 535a.

The threshold voltage adjustment circuit 511a may be connected between the first power line and the first node N1. The detection circuit 531a may be connected between the first power line and the second power line. The delay circuit 533a may be connected to the detection circuit 531a and may be between the first node N1 and the second power line, and the clamp circuit 535a may be connected to the delay circuit 533a and may be between the first power line and the second power line.

In an embodiment of the present inventive concept, the threshold voltage adjustment circuit 511a may correspond to the first circuit 510, and the detection circuit 531a, the delay circuit 533a, and the clamp circuit 535a may correspond to the second circuit 550. Accordingly, the threshold voltage adjustment circuit 511a may be disposed under each bonding pad of the semiconductor device, and the detection circuit 531a, the delay circuit 533a, and the clamp circuit 535a may be disposed under each probing pad of the semiconductor device.

In an embodiment of the present inventive concept, when an overvoltage or overcurrent is applied through the first power line and the second power line, the detection circuit 531a may detect the occurrence of the overvoltage or the overcurrent and may output a detection signal. The delay circuit 533a may output an inverted signal obtained by inverting the detection signal. When the overvoltage or the overcurrent is detected, the clamp circuit 535a may be shorted between the first power line and the second power line based on the inverted signal to prevent the overvoltage from being applied to or the overcurrent from flowing to other circuits connected between the first power line and the second power line.

In an embodiment of the present inventive concept, the threshold voltage adjustment circuit 511a may change a bias state of the delay circuit 533a by adjusting a voltage difference between the first power line and the first node N1. Based on the changed bias state, the delay circuit 533a may change a condition in which the clamp circuit 535a is shorted between the first power line and the second power line.

Referring to FIGS. 6A, 6B and 6C, an electrostatic discharge protection circuit 500b may include a threshold voltage adjustment circuit 511b, a detection circuit 531b, a delay circuit 533b, and a clamp circuit 535b.

The threshold voltage adjustment circuit 511b may include a first PMOS transistor 511-1 connected between the first power line and the first node N1 and may be diode-connected, and the detection circuit 531b may include a resistor 531-1 and a MOS capacitor 531-2 connected to each other in series between the first power line and the second power line.

The delay circuit 533b may include a second PMOS transistor 533-1 and a first NMOS transistor 533-2 connected to the detection circuit 531a and in series between the first node N1 and the second power line. In addition, the second PMOS transistor 533-1 and the first NMOS transistor 533-2 may receive the voltage of an output node N2 of the detection circuit 531a as a gate voltage. The clamp circuit 535b may include a second NMOS transistor 535-1 connected in series between the first power line and the second power line, and receiving a voltage of an output node N3 of the delay circuit 533b as a gate voltage.

In FIG. 6C, the delay circuit 533b is illustrated as including only one inverter circuit including the second PMOS transistor 533-1 and the first NMOS transistor 533-2, but the scope of the present inventive concept is not limited thereto. The delay circuit 533b may include two or more inverter circuits, and the output timing of the inverted signal may be adjusted based on the number of inverter circuits included in the delay circuit 533b.

In an embodiment of the present inventive concept, channel widths of the second PMOS transistor 533-1 and the first NMOS transistor 533-2 included in the delay circuit 533b may be substantially the same as each other. The channel width of the first PMOS transistor 511-1 included in the threshold voltage adjustment circuit 511b may be different from a channel width of each of the second PMOS transistor 533-1 and the first NMOS transistor 533-2 included in the delay circuit 533b. For example, the channel width of the first PMOS transistor 511-1 may be greater than the channel width of the second PMOS transistor 533-1 or the first NMOS transistor 533-2 by a preset multiple. For example, the threshold voltage adjustment circuit 511b is implemented with the first PMOS transistor 511-1 having an increased channel width, but may be implemented by connecting by connecting two or more PMOS transistors having the same specification as the second PMOS transistor 533-1 in parallel between the first power line and the first node N1. In this case, even if some of the PMOS transistors connected in parallel are damaged by a physical impact applied from the outside, the electrostatic discharge protection circuit 500b may operate normally because of the remaining PMOS transistors that are not damaged.

Figure 7:
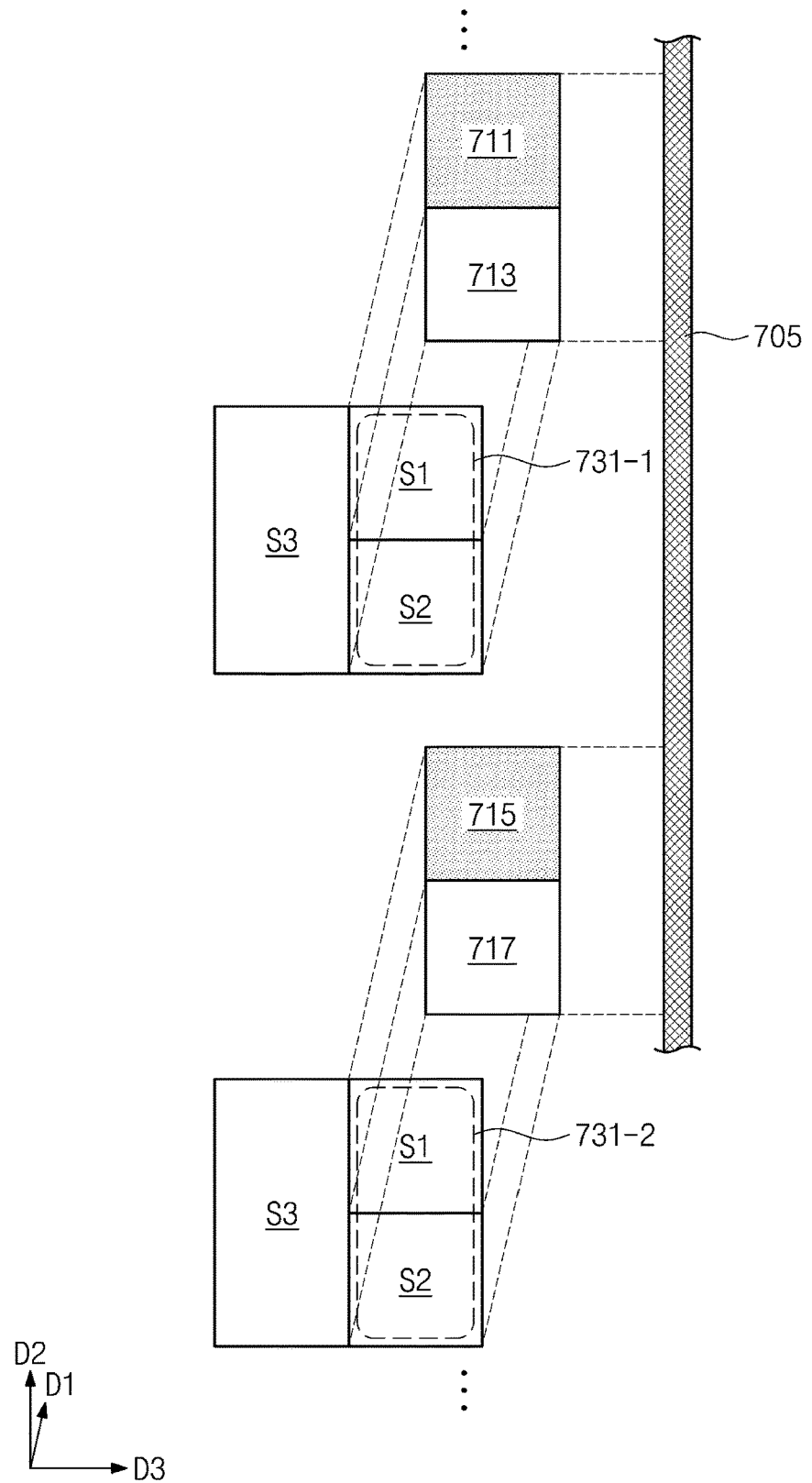
FIG. 7 is a diagram for describing spaces in which an electrostatic discharge protection circuit included in a semiconductor device of FIGS. 1 to 4 is formed.

FIG. 7 is a diagram for describing spaces in which an electrostatic discharge protection circuit included in a semiconductor device of FIGS. 1 to 4 is formed.

In FIG. 7, an edge 705 of a semiconductor device (e.g., 10, 10a, 10b, and 10c in FIG. 1 to 4) is illustrated, and pads 711, 713, 715, and 717 are illustrated. Each of the pads 711 and 715 may be the bonding pad of FIG. 2, and each of the pads 713 and 717 may be the probing pad of FIG. 2.

A space S1, a space S2, and a space S3 may correspond to the first space, the second space, and the third space described above with reference to FIGS. 5A, 5B, and 5C, respectively. For example, the space S1 may be a space inside the second semiconductor chip (e.g., 200 in FIGS. 1 and 3) included in the semiconductor device, under the bonding pad, and overlapping the bonding pad in a vertical direction. The space S2 may be a space inside the second semiconductor chip, under the probing pad, and overlapping the probing pad in a vertical direction. The space S3 may be a space inside the second semiconductor chip, and may be a space adjacent to at least one of the spaces S1 or S2 in a horizontal direction. In addition, the space S3 may be a space that does not overlap with each of the bonding pad and the probing pad in a vertical direction.

In an embodiment of the present inventive concept, an electrostatic discharge protection circuit may be formed in each of spaces 731-1 and 731-2. Each of the spaces 731-1 and 731-2 may include the spaces S1 and S2. For example, the threshold voltage adjustment circuit of the electrostatic discharge protection circuit may be disposed in the space S1 of each of the spaces 731-1 and 731-2, and the detection circuit, the delay circuit, and the clamp circuit of the electrostatic discharge protection circuit may be disposed in the space S2 of each of the spaces 731-1 and 731-2.

Figure 8A:
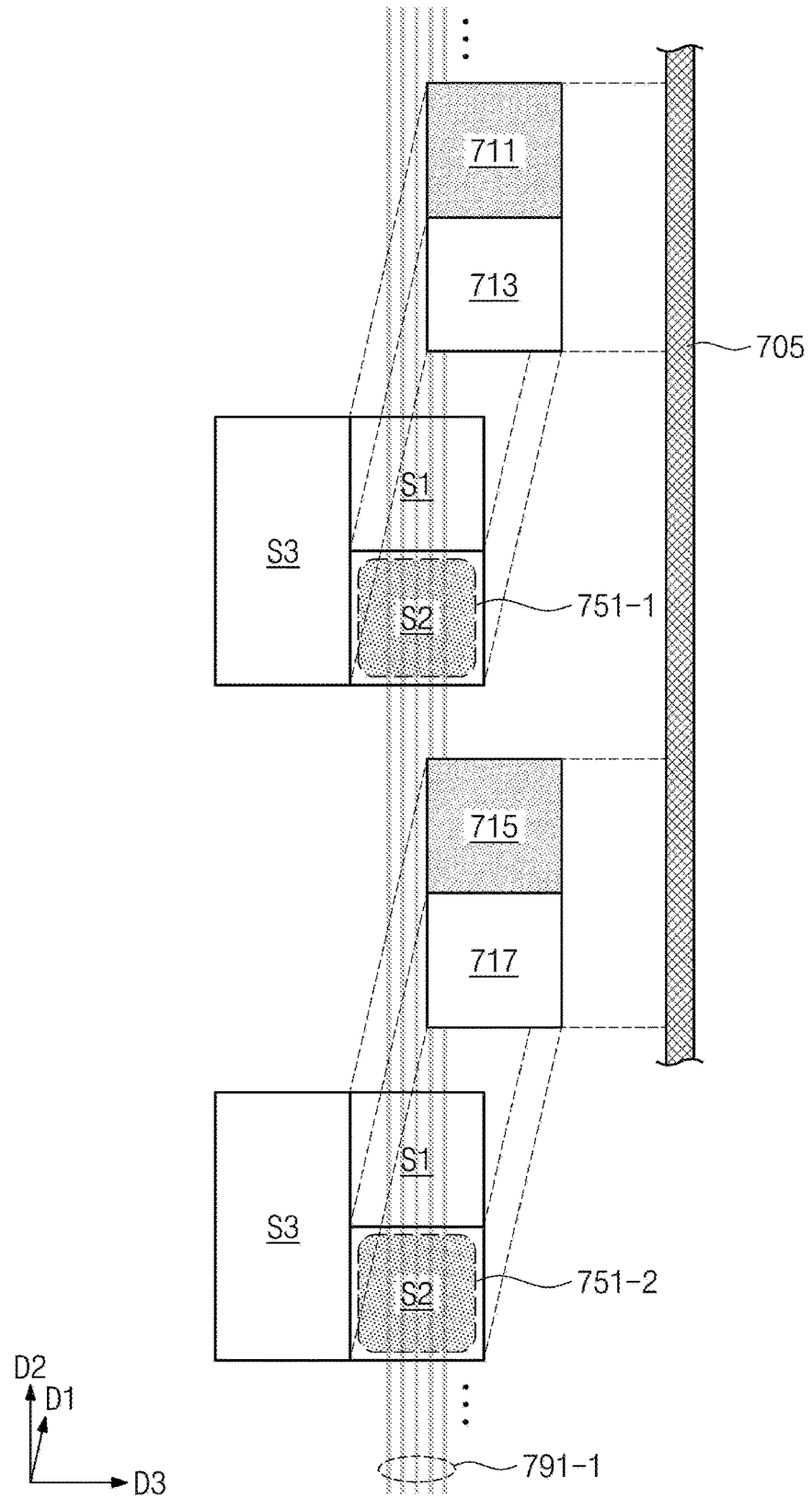
FIGS. 8A, 8B, and 8C are diagrams for describing spaces in which an input/output circuit included in a semiconductor device of FIGS. 1 to 4 is formed.
Figure 8B:
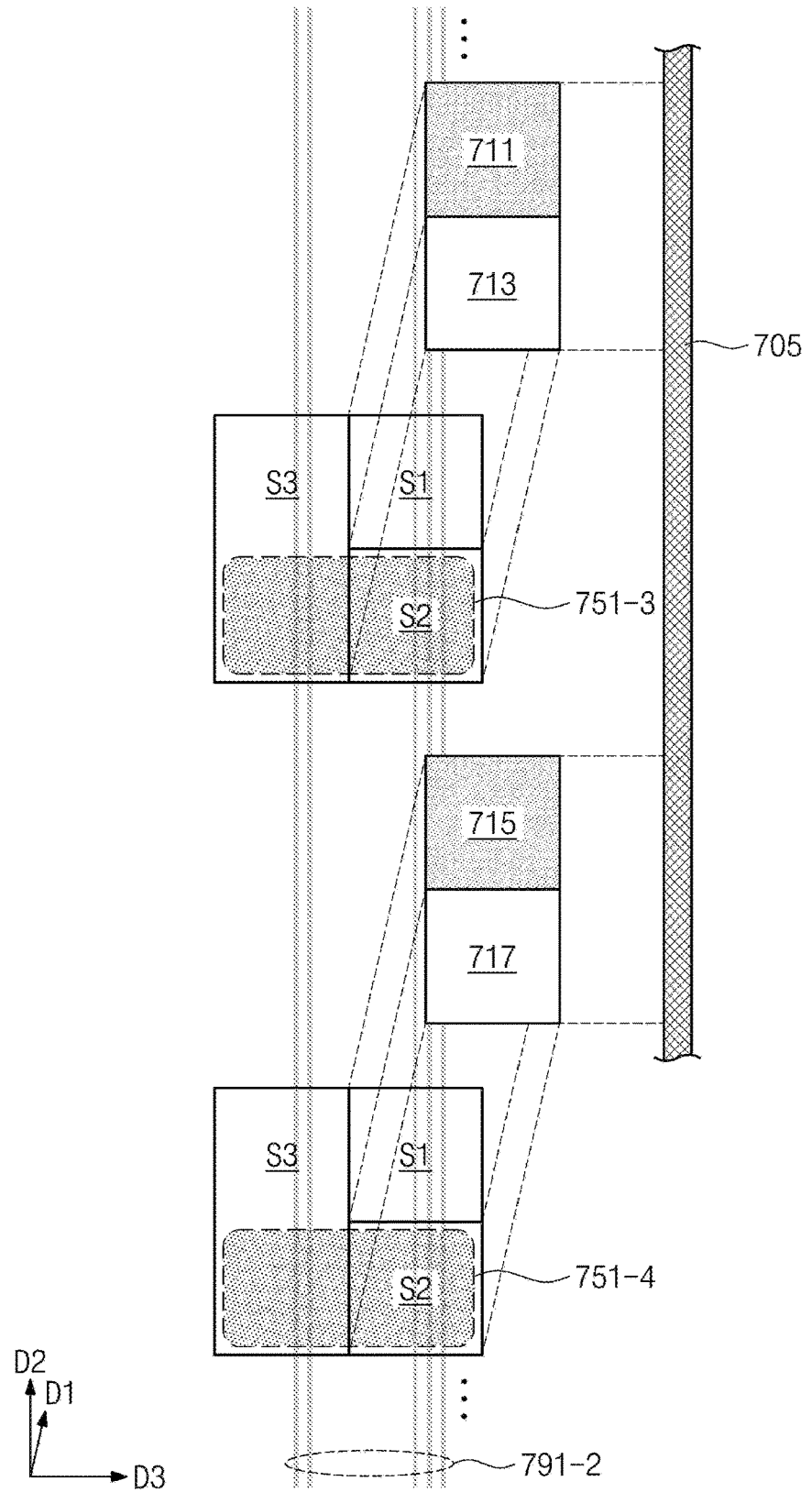
Figure 8C:
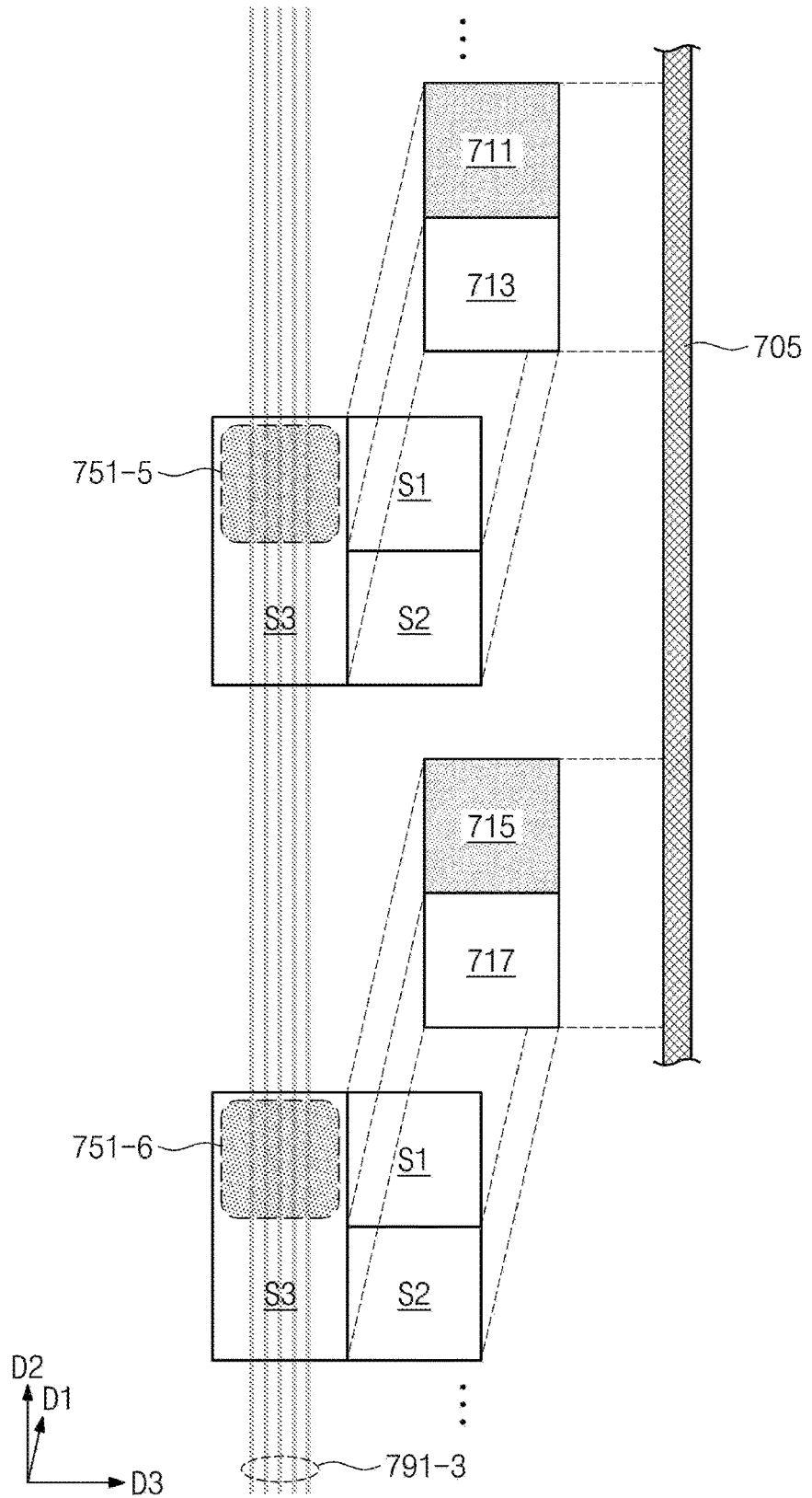

FIGS. 8A, 8B, and 8C are diagrams for describing spaces in which an input/output circuit included in a semiconductor device of FIGS. 1 to 4 is formed.

In FIGS. 8A, 8B, and 8C, similar to FIG. 7, the edge 705 of the semiconductor device, the plurality of pads 711, 713, 715, and 717 are illustrated, and the space S1, the space S2, and the space S3 are illustrated.

In an embodiment of the present inventive concept, the input/output circuit may be formed in the space S2 or the space S3, and a plurality of power lines connected to the input/output circuit and supplying power are further formed in the space S2 or the space S3.

Referring to FIG. 8A, the input/output circuit may be formed in each of spaces 751-1 and 751-2. Each of the spaces 751-1 and 751-2 may include the space S2. In this case, the plurality of power lines (e.g., 791-1) may be formed to pass through the space S2.

Referring to FIG. 8B, the input/output circuit may be formed in each of spaces 751-3 and 751-4. Each of the spaces 751-3 and 751-4 may include the space S2 and all or a portion of the space S3. In this case, the plurality of power lines (e.g., 791-2) may be formed to pass through the space S2 and the space S3.

Referring to FIG. 8C, the input/output circuit may be formed in each of spaces 751-5 and 751-6. Each of the spaces 751-5 and 751-6 may include all or a portion of the space S3. In this case, the plurality of power lines (e.g., 791-3) may be formed to pass through the space S3. For example, the plurality of power lines (e.g., 791-3) might not pass through the spaces S1 and S2.

The space in which the input/output circuit is formed according to one of the embodiments illustrated in FIGS. 8A, 8B and 8C may be determined based on a magnitude of a physical impact (hereinafter, referred to as a 'bonding impact') applied to the bonding pad during packaging of a semiconductor post-process.

In an embodiment of the present inventive concept, when the magnitude of the bonding impact is greater than or equal to a first threshold value and less than the second threshold value, the input/output circuit may be formed in the space S2 as illustrated in FIG. 8A. The second threshold value may be greater than the first threshold value. When the magnitude of the bonding impact is greater than or equal to the second threshold value, the input/output circuit may be formed in the space S3 as illustrated in FIG. 8C.

In an embodiment of the present inventive concept, the first threshold value and the second threshold value may be determined based on a degree to which the input/output circuit or the plurality of power lines are damaged by the bonding impact, according to a shape formed in the spaces S2 and S3. For example, when the input/output circuit or the plurality of power lines are damaged by the bonding impact to prevent stable production of the semiconductor device (i.e., when it adversely affects the yield of the semiconductor device), the input/output circuit or the plurality of power lines may be formed in the space S3 as illustrated in FIG. 8C. However, since the area occupied by the semiconductor device may increase to secure the space S3 inside the semiconductor device, the semiconductor device may be produced by comprehensively considering the yield of the semiconductor device and the area occupied by the semiconductor device, according to one of the embodiments illustrated in FIGS. 8A, 8B, and 8C.

Figure 9:
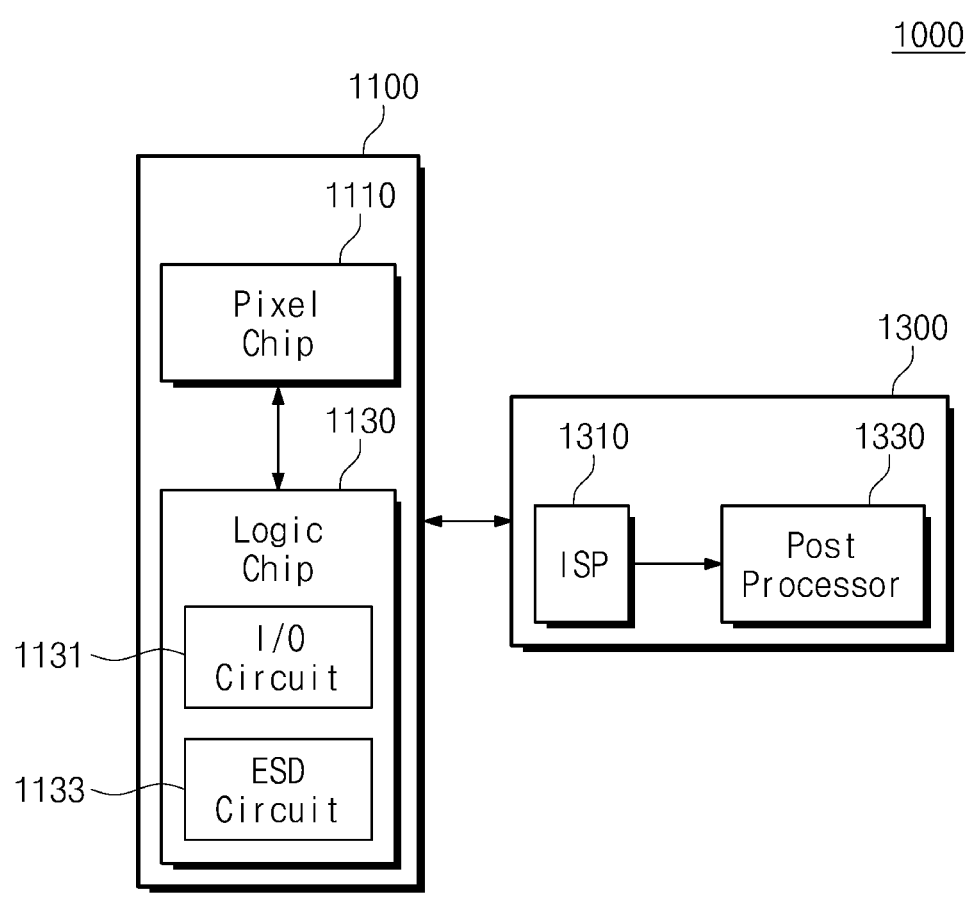
FIG. 9 is a block diagram illustrating an image sensing system including a semiconductor device, according to an embodiment of the present inventive concept.

FIG. 9 is a block diagram illustrating an image sensing system including a semiconductor device, according to an embodiment of the present inventive concept.

Referring to FIG. 9, an image sensing system 1000 may include an image sensor package 1100 and an image processing package 1300.

The image sensor package 1100 may include a semiconductor device (e.g., 10, 10a, 10b, and 10c of FIGS. 1 to 4), and may include a pixel chip 1110 and a logic chip 1130. The logic chip 1130 may include an input/output circuit 1131 and an electrostatic discharge (ESD) protection circuit 1133.

As described above with reference to FIGS. 1 to 4, the first semiconductor chip may be stacked on the second semiconductor chip. In addition, the pixel chip 1110 may be the first semiconductor chip 100, and the logic chip 1130 may be the second semiconductor chip 200.

In an embodiment of the present inventive concept, the first semiconductor chip may have an upper surface divided into a pixel array region and a connection region in which a plurality of pads are disposed. The first semiconductor chip may be stacked on the second semiconductor chip. The plurality of pads may include a first bonding pad, which is for connection with an external circuit, and a first probing pad, which is adjacent to the first bonding pad and is for an electrical die sorting (EDS) test.

In an embodiment of the present inventive concept, the first semiconductor chip may include a dummy wiring layer, and the second semiconductor chip may include an electrostatic discharge protection circuit and an input/output circuit.

In an embodiment of the present inventive concept, the dummy wiring layer may be formed in a space inside the first semiconductor chip, under the first bonding pad, and vertically overlapping with the first bonding pad. A portion of the electrostatic discharge protection circuit may be formed in a space inside the second semiconductor chip, under the dummy wiring layer, and vertically overlapping with the first bonding pad. Another portion of the electrostatic discharge protection circuit may be formed in a space inside the second semiconductor chip, under the first probing pad, and vertically overlapping with the first probing pad.

In an embodiment of the present inventive concept, the input/output circuit is formed in a space that does not overlap the first bonding pad in a vertical direction, a space that overlaps the first probing pad in a vertical direction, and all or some of a space that does not overlap the first probing pad in a vertical direction, as a space inside the second semiconductor chip.

In an embodiment of the present inventive concept, the pixel chip 1110 may include a plurality of pixels, and the plurality of pixels may have a matrix shape and may be repeatedly arranged at specific intervals in row and column directions. For example, the plurality of pixels may be arranged on an upper surface of the pixel chip 1110, and may be arranged in a pixel array region (e.g., PAR of FIGS. 1 to 4) of the pixel chip 1110. Each of the plurality of pixels may sense light incident through a camera lens depending on a shutter operation, may perform photoelectric conversion to generate photocharges, and may output pixel signals based on the photocharges.

In an embodiment of the present inventive concept, the logic chip 1130 may include a row driver and a column driver. The row driver and the column driver may be connected to the plurality of pixels through a plurality of rows and a plurality of columns, and may drive the plurality of pixels by activating the plurality of rows and the plurality of columns. The logic chip 1130 may further include a comparator block, a counter block, and a ramp signal generator.

The image processing package 1300 may include an image signal processor 1310 and a post-processor 1330.

In an embodiment of the present inventive concept, the image signal processor 1310 and the post-processor 1330 may output digital image data by performing digital signal processing based on various algorithms with respect to digital data output from the logic chip 1130. For example, the image signal processor 1310 and the post-processor 1330 may generate YUV data including differences between a luminance component and a color component based on digital data output from the logic chip 1130 or may generate compression data, for example, joint photography experts group (JPEG) data.

In an embodiment of the present inventive concept, the image sensor package 1100 and the image processing package 1300 may communicate with each other through a Serial Peripheral Interface (SPI) and/or an Inter Integrated Circuit (I2C) interface.

As the above descriptions, the semiconductor device according to an embodiment of the present inventive concept includes a first semiconductor chip and a second semiconductor chip disposed under the first semiconductor chip, and can effectively disperse physical impacts applied to the semiconductor device through pads during probing and bonding, by providing bonding pads for connection with external circuits on the upper surface of the first semiconductor chip separately from probing pads for EDS testing.

One bonding pad and one probing pad may be arranged to form a pad-pair, and one or more spaces may be defined in lower portions of the bonding pad and the probing pad forming one pad-pair. According to an embodiment of the present inventive concept, since specific circuits (e.g., an input/output circuit or an electrostatic discharge protection circuit) and a dummy wiring layer are disposed at predetermined positions in the defined spaces, the semiconductor device may be implemented to operate as normal as possible despite the physical impact.

According to an embodiment of the present inventive concept, the semiconductor device can be produced stably despite the physical impact while minimizing the influence of the physical impact by the above configuration.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:
1. An image sensor comprising:
a first chip comprising a pixel array region and a connection region around the pixel array region;
a second chip disposed on the first chip and comprising an input and output circuit;
a first bonding pad for connection with an external circuit; and
a first probing pad adjacent to the first bonding pad and for an electrical die sorting (EDS) test,
wherein the second chip comprises:
a first space overlapping the first bonding pad in a vertical direction;
a second space overlapping the first probing pad in the vertical direction; and
a third space adjacent to at least one of the first space or the second space in a horizontal direction, and in which at least a portion of the input and output circuit is formed, and
wherein the first bonding pad and the first probing pad are disposed on the connection region in a plan view.

2. The image sensor of claim 1, wherein the first chip is connected to the second chip through metal electrodes.

3. The image sensor of claim 2, further comprising:
a plurality of power lines disposed to pass through the third space in the plan view and being connected to the input and output circuit.

4. The image sensor of claim 1, wherein the first chip is connected to the second chip through a through-silicon-via.

5. The image sensor of claim 4, further comprising:
a second bonding pad for connection with the external circuit; and
a second probing pad adjacent to the second bonding pad and for the EDS test.

6. The image sensor of claim 5, wherein the first bonding pad and the first probing pad form a first pad-pair, and
wherein the second bonding pad and the second probing pad form a second pad-pair having a similar shape to the first pad-pair.

7. The image sensor of claim 6, wherein the metal electrodes are disposed on the connection region in the plan view.

8. The image sensor of claim 1, further comprising:
an electrostatic discharge protection circuit, and
wherein at least a portion of the electrostatic discharge protection circuit is formed in the first space.

9. The image sensor of claim 1, wherein the first chip further comprises:
a dummy wiring layer disposed over the first bonding pad.

10. The image sensor of claim 9, further comprising:
a connection bump disposed on the first bonding pad connected to the external circuit.

11. An image sensor comprising:
a first chip comprising a pixel array region, a first connection region disposed on a first side of the pixel array region in a plan view, and a second connection region disposed on a second side of the pixel array region in the plan view;
a second chip disposed on the first chip and comprising an input and output circuit;
a first bonding pad for connection with an external circuit;
a second bonding pad for connection with the external circuit;
a first probing pad for an electrical die sorting (EDS) test; and
a second probing pad for the EDS test,
wherein the first bonding pad and the first probing pad are disposed on the first connection region in the plan view,
wherein the second bonding pad and the second probing pad are disposed on the second connection region in the plan view, and
wherein the pixel array region is disposed between the first connection region and the second connection region.

12. The image sensor of claim 11, wherein the first chip is connected to the second chip through metal electrodes.

13. The image sensor of claim 11, wherein the first chip is connected to the second chip through a through-silicon-via.

14. The image sensor of claim 11, wherein at least a portion of the input and output circuit is not vertically overlapping with the first bonding pad in the plan view.

15. The image sensor of claim 11, wherein at least a portion of the input and output circuit is not vertically overlapping with the second bonding pad in the plan view.

16. The image sensor of claim 11, wherein the second chip further comprises:
a first space overlapping the first bonding pad in a vertical direction;
a second space overlapping the first probing pad in the vertical direction; and
a third space adjacent to at least one of the first space or the second space in a horizontal direction, and in which at least a portion of the input and output circuit is formed.

17. The image sensor of claim 16, further comprising:
a plurality of power lines disposed to pass through the third space in the plan view and being connected to the input and output circuit.

18. The image sensor of claim 11, wherein the first probing pad is disposed adjacent to the first bonding pad,
wherein the first probing pad and the first bonding pad form a first pad-pair,
wherein the second probing pad is disposed adjacent to the second bonding pad, and
wherein the second probing pad and the second bonding pad form a second pad-pair having a similar shape to the first pad-pair.

19. An image sensor comprising:
a first chip comprising a pixel array region, a first connection region disposed on a first side of the pixel array region in a plan view, and a second connection region disposed on a second side of the pixel array region in the plan view;
a second chip disposed on the first chip and comprising an input and output circuit;
a first bonding pad for connection with an external circuit;
a first probing pad adjacent to the first bonding pad and for an electrical die sorting (EDS) test;
a second bonding pad for connection with the external circuit; and
a second probing pad adjacent to the second bonding pad and for the EDS test,
wherein the first bonding pad and the first probing pad are disposed on the first connection region in the plan view,
wherein the second bonding pad and the second probing pad are disposed on the second connection region in the plan view,
wherein the pixel array region is disposed between the first connection region and the second connection region, wherein the first probing pad and the first bonding pad form a first pad-pair, and wherein the second probing pad and the second bonding pad form a second pad-pair having a similar shape to the first pad-pair.

20. The image sensor of claim 19, wherein the first chip is connected to the second chip through metal electrodes.

* * * * *